(12) United States Patent
Wise

(10) Patent No.: US 8,786,447 B1
(45) Date of Patent: Jul. 22, 2014

(54) HIGH VOLTAGE DETECTION ASSEMBLY

(76) Inventor: Bryan C. Wise, Threesprings, PA (US)

( * ) Notice: Subject to any disclaimer, the term of this patent is extended or adjusted under 35 U.S.C. 154(b) by 201 days.

(21) Appl. No.: 13/405,348

(22) Filed: Feb. 26, 2012

(51) Int. Cl.
G08B 23/00 (2006.01)

(52) U.S. Cl.
USPC ........................................ 340/573.4; 340/662

(58) Field of Classification Search
CPC ....... G01V 3/081; G01R 19/155; G01R 29/12
USPC .............. 340/662, 685, 573.1, 573.4; 361/88, 361/91.1
See application file for complete search history.

(56) References Cited

U.S. PATENT DOCUMENTS

| 274,892 | A | | 4/1883 | Anger |
| 510,881 | A | | 12/1893 | Bennett |
| 3,745,549 | A | | 7/1973 | Jepperson et al. |
| 3,786,468 | A | | 1/1974 | Moffitt |
| 4,649,375 | A | | 3/1987 | Duppong et al. |
| 5,200,736 | A | * | 4/1993 | Coombs et al. ................ 340/586 |
| 6,124,798 | A | | 9/2000 | Tai et al. |
| 6,150,945 | A | | 11/2000 | Wilson |
| 6,170,607 | B1 | | 1/2001 | Freeman et al. |
| 6,329,924 | B1 | * | 12/2001 | McNulty ........................ 340/662 |
| 6,788,215 | B1 | * | 9/2004 | White ............................ 340/657 |
| 6,853,307 | B2 | | 2/2005 | Nickerson |
| 2004/0080320 | A1 | * | 4/2004 | Golub ............................ 324/457 |
| 2005/0264427 | A1 | * | 12/2005 | Zeng et al. ..................... 340/635 |
| 2007/0132581 | A1 | * | 6/2007 | Molyneaux et al. ......... 340/573.1 |
| 2009/0322512 | A1 | * | 12/2009 | Frederick ................. 340/539.11 |
| 2013/0033258 | A1 | * | 2/2013 | Parr et al. ................. 324/207.22 |

* cited by examiner

Primary Examiner — Thomas Mullen

(57) ABSTRACT

A high voltage detection assembly is worn by a user to provide a warning signal when high voltage is detected in close proximity to the user. The assembly includes a housing having a bottom, a top, and a perimeter wall extending between the bottom and the top defining an interior space. A voltage sensor is coupled to the housing. A processor is positioned in the interior space of the housing and electrically coupled to the voltage sensor. A speaker is coupled to the housing and operationally coupled to the processor. The processor transmits an audible signal through the speaker when the voltage sensor detects ambient voltage in excess of a pre-determined voltage level.

8 Claims, 5 Drawing Sheets

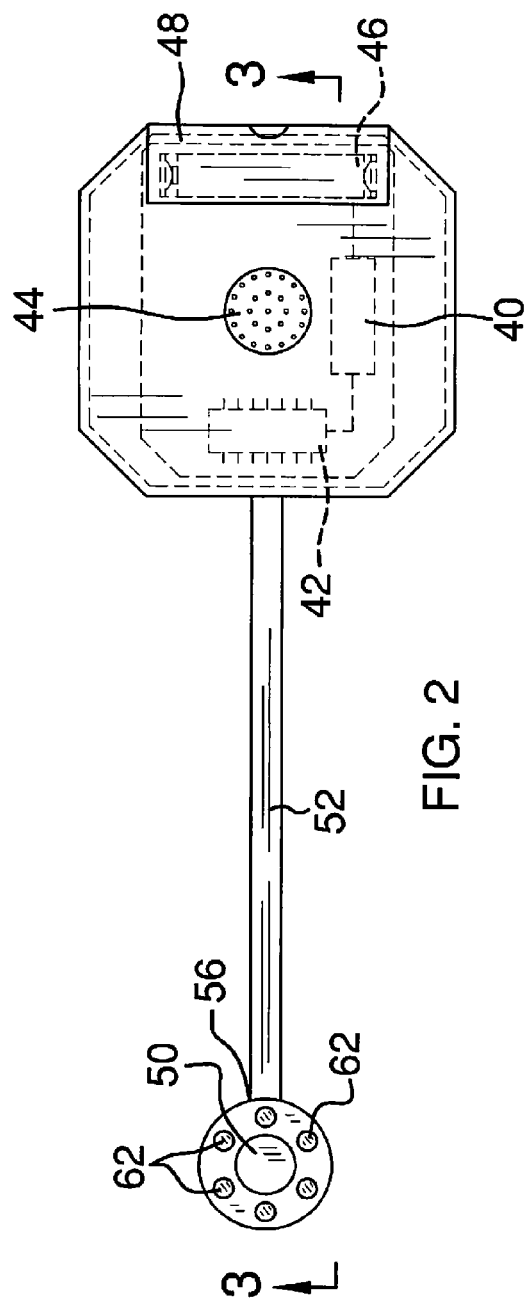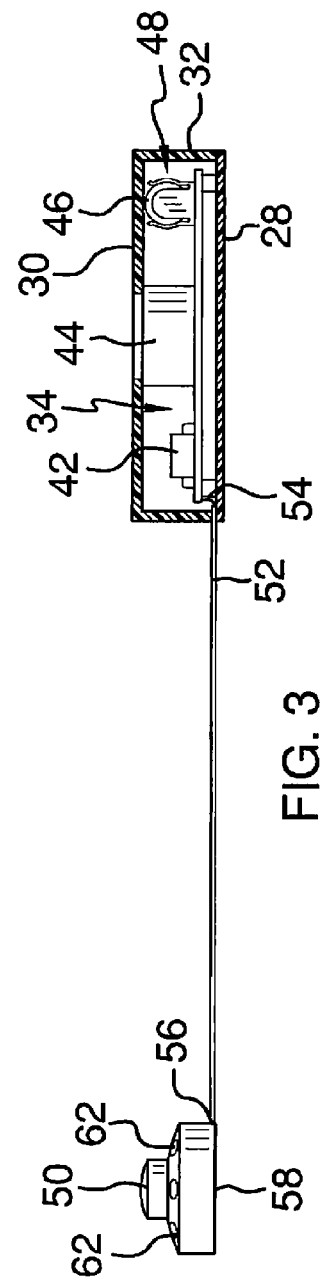

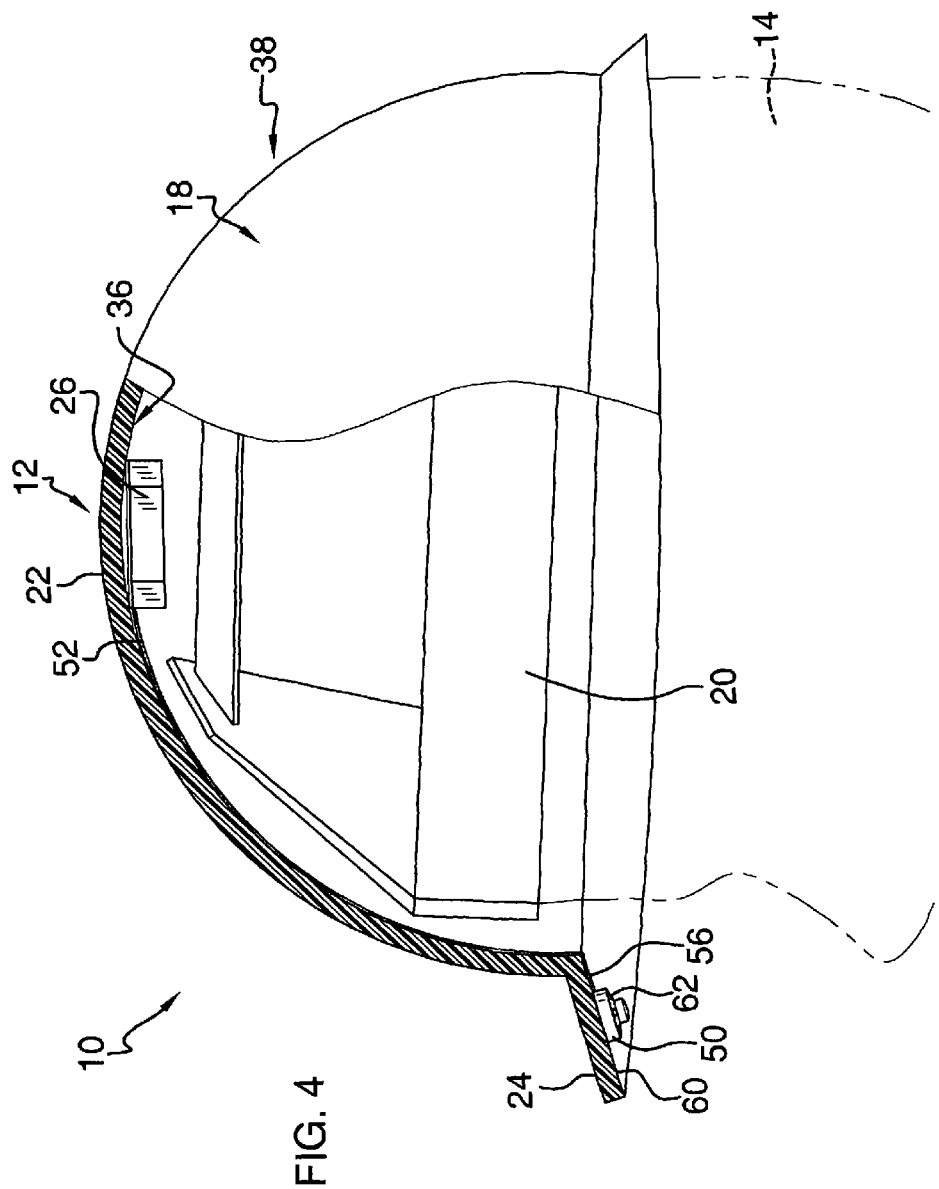

HIGH VOLTAGE DETECTION ASSEMBLY

BACKGROUND OF THE DISCLOSURE

1. Field of the Disclosure

The disclosure relates to voltage detection devices and more particularly pertains to a new voltage detection device worn by a user to provide a warning signal when high voltage is detected in close proximity to the user.

2. Summary of the Disclosure

An embodiment of the disclosure meets the needs presented above by generally comprising a housing having a bottom, a top, and a perimeter wall extending between the bottom and the top defining an interior space. A voltage sensor is coupled to the housing. A processor is positioned in the interior space of the housing and electrically coupled to the voltage sensor. A speaker is coupled to the housing and operationally coupled to the processor. The processor transmits an audible signal through the speaker when the voltage sensor detects ambient voltage in excess of a pre-determined voltage level.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein:

FIG. 2 is a top view of an embodiment of the disclosure.

FIG. 3 is a cross-sectional view of an embodiment of the disclosure taken along line 3-3 of FIG. 2.

FIG. 4 is a partial cut-away side view of an embodiment of the disclosure in use.

DESCRIPTION OF THE PREFERRED EMBODIMENT

Figure 1:
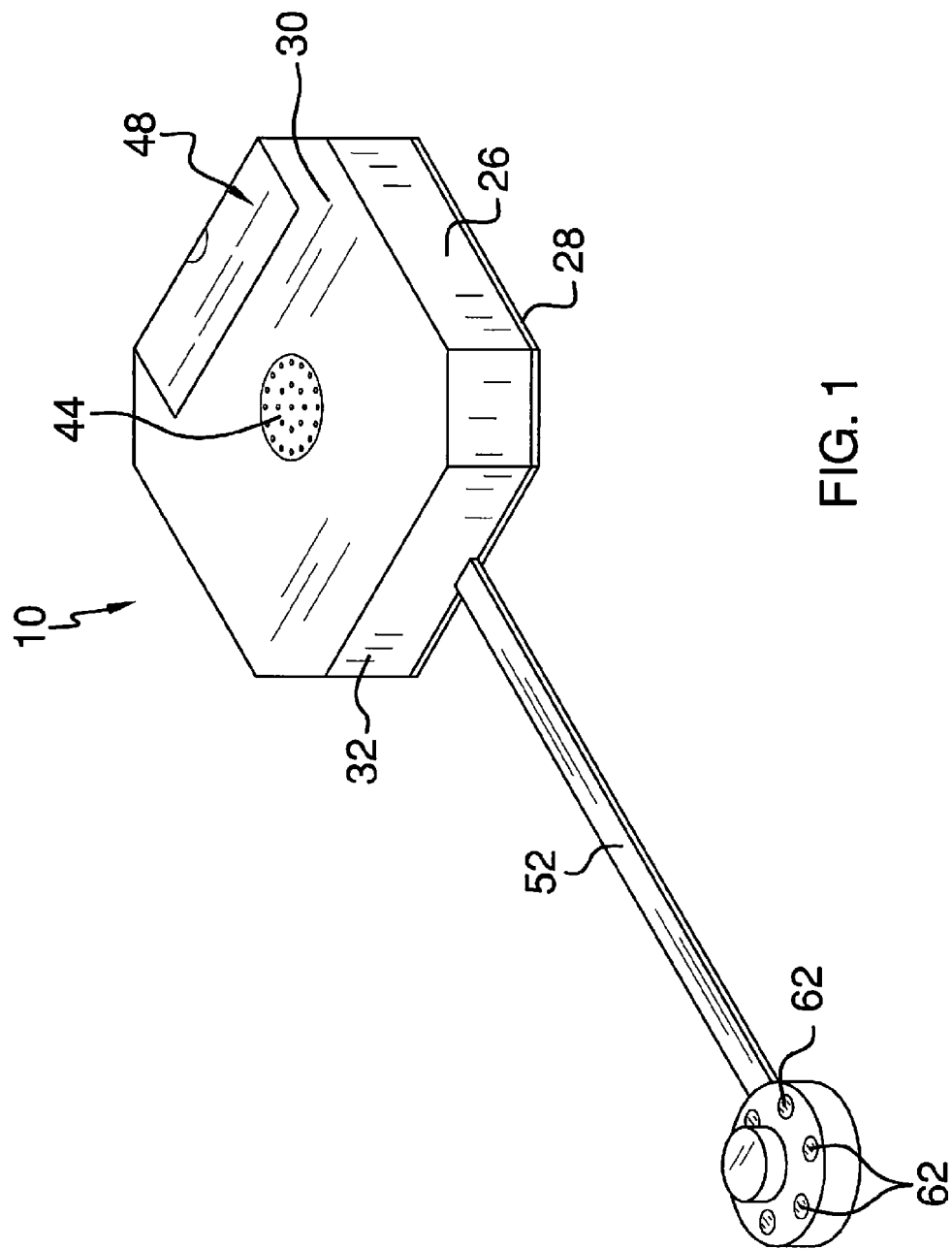
FIG. 1 is a top front side perspective view of a high voltage detection assembly according to an embodiment of the disclosure.

With reference now to the drawings, and in particular to FIGS. 1 through 6 thereof, a new voltage detection device embodying the principles and concepts of an embodiment of the disclosure and generally designated by the reference numeral 10 will be described.

As best illustrated in FIGS. 1 through 6, the high voltage detection assembly 10 generally comprises a hat 12 configured for being worn on a human head 14. The hat 12 may have a hard protective shell 18 coupled to an adjustable harness 20 supported on the head 14. The hat 12 has a crown portion 22 and a brim portion 24.

A housing 26 has a bottom 28, a top 30, and a perimeter wall 32 extending between the bottom 28 and the top 30 defining an interior space 34. The housing 26 is coupled to a garment 38. The garment may be the hat 12 or another type of garment worn by a user in an area where high voltage detection might be desirable. More particularly, the housing 26 may be coupled to an interior surface 36 of the crown portion 22 of the hat 12. A voltage sensor 40 is coupled to the housing 12, typically in the interior space 34. A processor 42 is positioned in the interior space 34 of the housing 26. The processor 42 is electrically coupled to the voltage sensor 40. A speaker 44 is coupled to the housing 26 and is operationally coupled to the processor 42. The processor 42 transmits an audible signal through the speaker 44 when the voltage sensor 40 detects ambient voltage in excess of a pre-determined voltage level indicating potential imminent danger to a user of the assembly 10. The voltage sensor 40 may, in particular, comprise a device which detects a magnetic field as sources of electricity form a magnetic field. The greater the voltage, the greater the magnetic field and thus the sensor 40 may be adjusted depending on the type of work being performed to detect particular amounts of voltage.

It is understood that voltage level is less important than amperage when determining the amount of electricity that is dangerous to a human body, however understanding the working conditions (i.e. protective clothing, surfaces on which a person stands) in which the sensor 40 is positioned will allow this calculation to be made. However, the sensor may typically be configured to detect over 100 volts or a potential amperage of at least 30 mA alternating current after general resistances are calculated.

Figure 5:
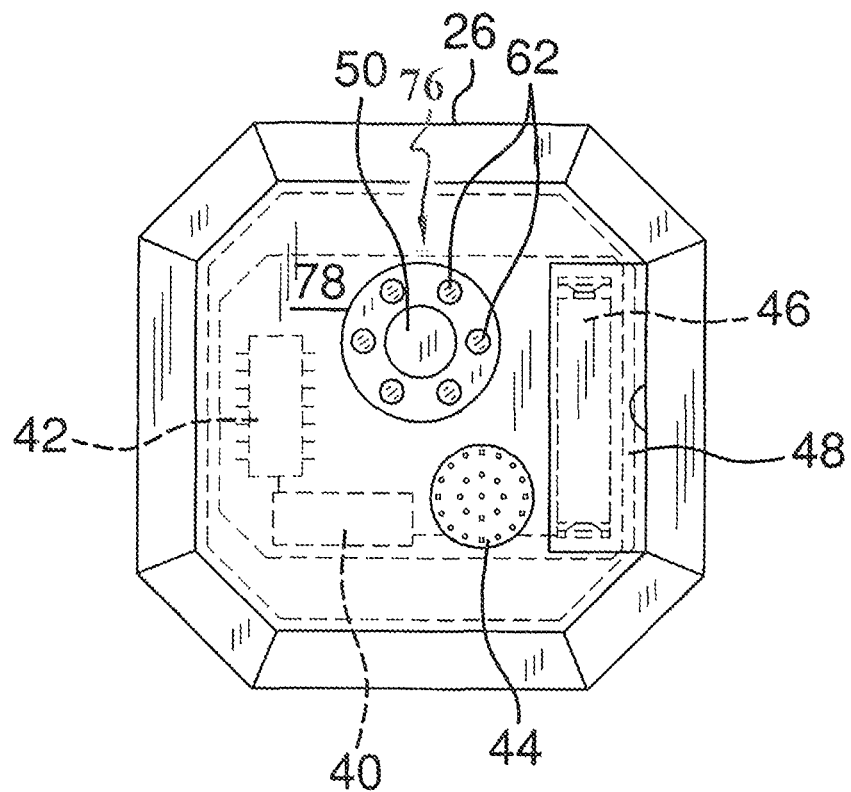
FIG. 5 is a top view of an alternative embodiment of the disclosure.
Figure 6:
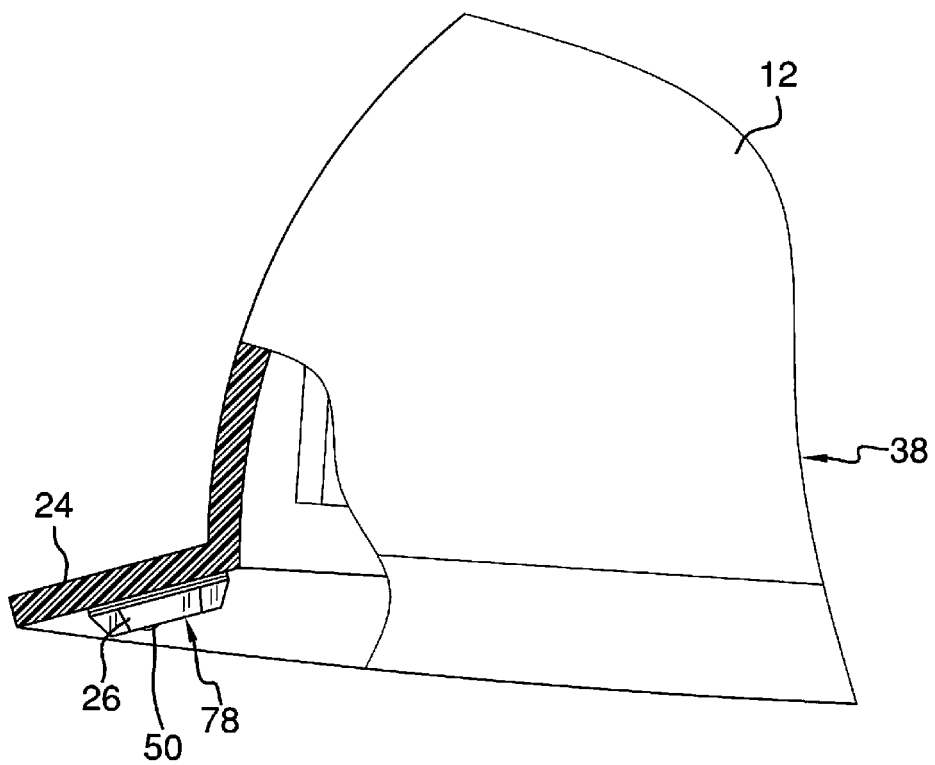
FIG. 6 is a partial cut-away side view of an alternative embodiment of the disclosure in use.

The assembly 10 may be powered by a battery 46 positioned in a battery compartment 48 positioned in the housing 26. The battery 46 is positioned in the battery compartment 48 and electrically coupled to the processor 42. The processor 42 may be programmed to monitor a power level of the battery 46 to provide an audible indication that the battery 46 may need replacement. Thus, the assembly 10 may be left in a ready condition without having to be activated by a user. A switch 50 may also be operationally coupled to the processor 42 for selectively activating and deactivating the processor 42. The switch 50 may be coupled to the brim portion 24 of the hat 12 in spaced relationship to the housing 26 to facilitate access to the switch 50 while leaving the housing 26 in a position proximate a center of gravity of the hat 12. A low profile or flat cable 52 has a first end 54 electrically coupled to the processor 42 and a second end 56 coupled to the switch 50. The first end 54 is positioned in the interior space 34 of the housing 26. The cable 52 extends outwardly from the housing 26 such that the second end 56 is positioned outside the housing 26 where it is coupled to the switch 50. An adhesive 58 may be used for coupling the switch 50 to an interior surface 60 of the brim portion 24 of the hat 12. A single light or a plurality of lights 62 may be used to provide a visual signal as well as the audible signal provided through the speaker 44. The lights 62 are operationally coupled to the processor 42 and powered by the battery 46 to be illuminated upon detection of ambient voltage in excess of the pre-determined voltage level. The lights 62 may be arranged around the switch 50 so they are also positioned on the brim portion 24 of the hat 12 to facilitate visibility of the lights 62. Alternatively, as shown in FIGS. 5-6, the switch 50 and lights 62 may be coupled to an exterior surface 78 of the housing 26 providing a single unit 76 attachable directly to the brim portion 24 of the hat 12 or another garment.

In use, the hat 12 or other garment is worn holding the housing 26, voltage sensor 40, processor 42, battery 46 and switch 50. The switch 50 is manipulated to activate the processor 42 and voltage sensor 40. When the voltage sensor 40 detects voltage higher than a pre-determined threshold level, the processor 42 transmits an audible signal through the speaker 40 and illuminates the lights 62 to provide a warning of the imminent danger of high voltage in close proximity to the user.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure.

I claim:

1. A high voltage detection assembly comprising:
   a hat configured for being worn on a human head, said hat having a crown portion and a brim portion;
   a housing having a bottom, a top, and a perimeter wall extending between said bottom and said top defining an interior space, said housing being coupled to said hat, said housing being coupled to an interior surface of said crown portion;
   a voltage sensor coupled to said housing;
   a processor positioned in said interior space of said housing, said processor being electrically coupled to said voltage sensor;
   a speaker coupled to said housing, said speaker being operationally coupled to said processor, said processor transmitting an audible signal through said speaker when said voltage sensor detects ambient voltage in excess of a pre-determined voltage level; and
   a switch, said switch being operationally coupled to said processor for selectively activating and deactivating said processor, said switch being coupled to said brim portion.

2. The assembly of claim 1, further comprising:
   a battery compartment in said housing; and
   a battery positioned in said battery compartment, said battery being electrically coupled to said processor.

3. The assembly of claim 1, further including a cable having a first end electrically coupled to said processor and a second end coupled to said switch.

4. The assembly of claim 3, further including said first end being positioned in said interior space of said housing, said cable extending outwardly from said housing, said second end being positioned outside said housing.

5. The assembly of claim 4, further including an adhesive coupled to said switch whereby said switch is configured for being coupled to a surface of a garment worn by a user.

6. The assembly of claim 1, further including a plurality of lights, said lights being operationally coupled to said processor whereby said lights are configured for being illuminated upon detection of ambient voltage in excess of the pre-determined voltage level.

7. The assembly of claim 1, further including said hat having a hard protective shell.

8. A high voltage detection assembly comprising:
   a hat configured for being worn on a human head, said hat having a hard protective shell, said hat having a crown portion and a brim portion;
   a housing having a bottom, a top, and a perimeter wall extending between said bottom and said top defining an interior space, said housing being coupled to said hat, said housing being coupled to an interior surface of said crown portion;
   a voltage sensor coupled to said housing;
   a processor positioned in said interior space of said housing, said processor being electrically coupled to said voltage sensor;
   a speaker coupled to said housing, said speaker being operationally coupled to said processor, said processor transmitting an audible signal through said speaker when said voltage sensor detects ambient voltage in excess of a pre-determined voltage level;
   a battery compartment positioned in said housing;
   a battery positioned in said battery compartment, said battery being electrically coupled to said processor;
   a switch, said switch being operationally coupled to said processor for selectively activating and deactivating said processor, said switch being coupled to said brim portion of said hat;
   a cable having a first end electrically coupled to said processor and a second end coupled to said switch, said first end being positioned in said interior space of said housing, said cable extending outwardly from said housing, said second end being positioned outside said housing;
   an adhesive coupling said switch to an interior surface of said brim portion of said hat; and
   a plurality of lights, said lights being operationally coupled to said processor whereby said lights are configured for being illuminated upon detection of ambient voltage in excess of the pre-determined voltage level.

* * * * *